United States Patent

Ishii et al.

[11] Patent Number: 6,077,342
[45] Date of Patent: Jun. 20, 2000

[54] LIGAO$_2$ SINGLE CRYSTAL, SINGLE-CRYSTAL SUBSTRATE, AND METHOD OF MANUFACTURING THE SAME

[75] Inventors: Takao Ishii; Shintaro Miyazawa, both of Kanagawa; Yasuo Tazou, Tokyo, all of Japan

[73] Assignee: Nippon Telegraph and Telephone Corporation, Japan

[21] Appl. No.: 09/296,899

[22] Filed: Apr. 22, 1999

Related U.S. Application Data

[62] Division of application No. 09/014,305, Jan. 27, 1998, Pat. No. 5,924,229.

[30] Foreign Application Priority Data

Jan. 30, 1997 [JP] Japan ............................... 9-33262
Mar. 24, 1997 [JP] Japan ............................... 9-69597

[51] Int. Cl.$^7$ ............................... C30B 15/02
[52] U.S. Cl. ............................... 117/1; 117/13; 423/328.1
[58] Field of Search ............................... 117/1, 13; 423/328.1

[56] References Cited

U.S. PATENT DOCUMENTS 3,283,164  11/1966  Remeika ............................... 250/225

FOREIGN PATENT DOCUMENTS 0299570   1/1989   European Pat. Off. ............ 117/2
0711853A  5/1996   European Pat. Off. ...... H01L 21/203
1086555A  12/1964  United Kingdom ............ C01D 11/02
WO 96/42114  12/1996  WIPO ............................... H01L 33/00

OTHER PUBLICATIONS

Kryliouk et al., "MOCVD Growth OG GaN Films on Lattice-Matched Oxide Substrates", Symposium III-V Nitrides, Materials Research Soc. Symp. Proc., 449(2), pp. 123–128, Dec. 6, 1996.

*Primary Examiner*—Felisa Hiteshew
*Attorney, Agent, or Firm*—Townsend and Townsend and Crew LLP; Kenneth R. Allen

[57] ABSTRACT

An LiGaO$_2$ single crystal manufactured by the Czochralski method has a crystallographic axis as a pulling direction set within an angle range of 30° from a b- or a-axis direction. An LiGaO$_2$ single-crystal substrate and a method of manufacturing the single crystal and the substrate are also disclosed.

8 Claims, 2 Drawing Sheets

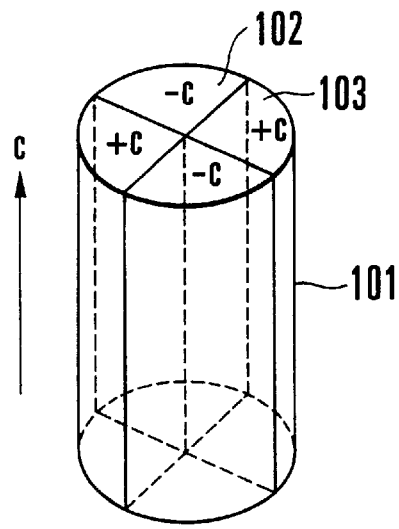
FIG. 1A
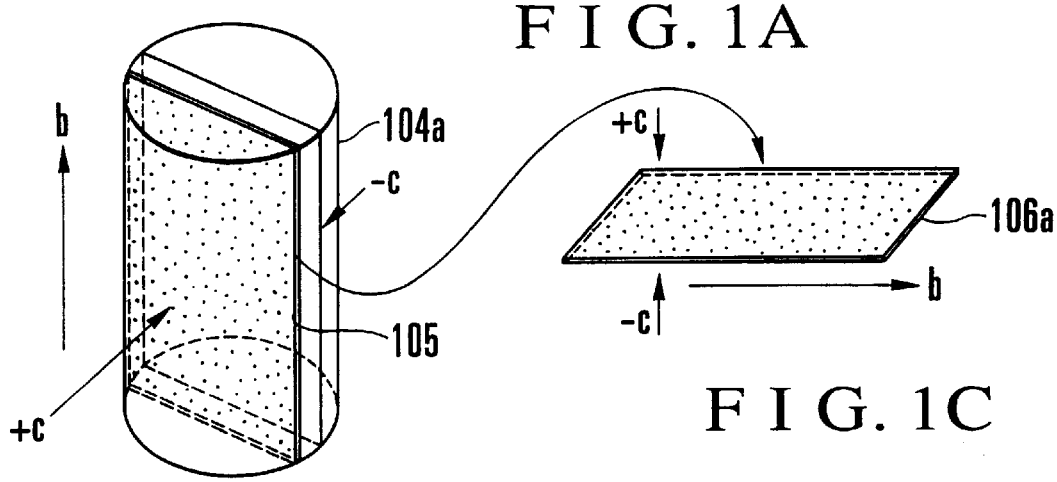
FIG. 1B
FIG. 1C
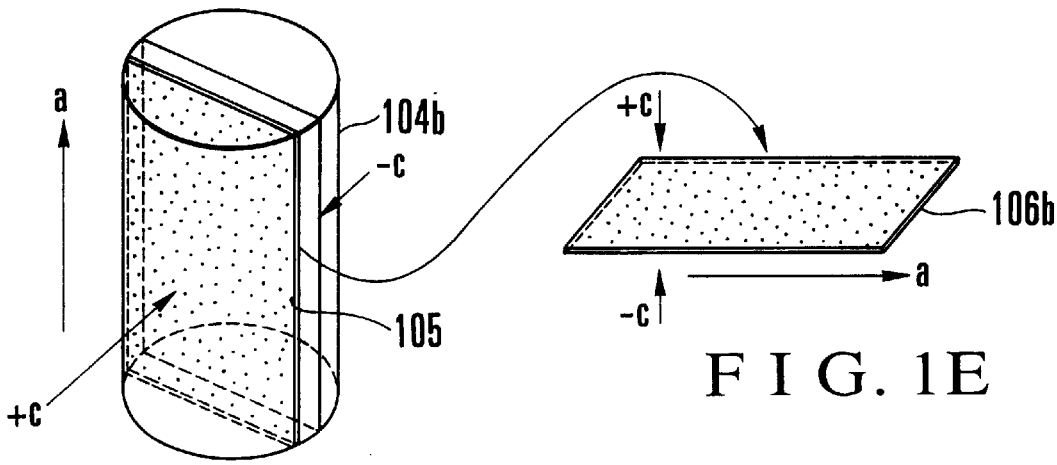
FIG. 1D
FIG. 1E

LIGAO$_2$ SINGLE CRYSTAL, SINGLE-CRYSTAL SUBSTRATE, AND METHOD OF MANUFACTURING THE SAME

This application is a divisional of Ser. No. 09/014,306 filed Jan. 27, 1998, now U.S. Pat. No. 5,924,229, which claims priority from Japanese application numbers 33262/1997 Jan. 30, 1997 and 69597/1997 filed Mar. 24, 1997 the disclosures of which are incorporated by reference.

BACKGROUND OF THE INVENTION

The present invention relates to an LiGaO$_2$ single crystal, an LiGaO$_2$ single-crystal substrate, and a method of manufacturing the same.

In recent years, III-V nitride compound semiconductors (Ga, In, Al)N have received a great deal of attention as one of light-emitting device material candidates in a short wavelength range of blue or bluish green to ultraviolet.

These nitride-based materials are characterized in their high hardness, high melting points, and high thermal conductivities. In addition, they have a direct transition type band structure as an energy band structure. The bandgap energy at room temperature can be changed from 1.95 eV to 6.0 eV using a mixed crystal of the nitride-based materials. The nitride-based materials are expected to be applied not only as light-emitting devices but also high-power transistors or environmental resistance semiconductor devices because of their large band gaps.

Conventionally, no appropriate substrate for epitaxially growing a gallium-nitride-based semiconductor is available, and a gallium-nitride-based semiconductor thin film is grown on a sapphire substrate (Al$_2$O$_3$) substrate regardless of the large lattice mismatch (13%) between GaN film and sapphire substrate. However, when GaN is directly grown on the sapphire substrate at a high temperature, GaN exhibits a three-dimensional hexagonal pyramidal growth pattern because of the large lattice mismatch, so the crystal growth surface cannot be a flat mirror surface.

For this reason, AlN or GaN is generally grown at a low temperature as an amorphous film serving as a buffer layer, and GaN is grown on the buffer layer at a high temperature.

However, the dislocation density of the GaN film grown by this method is as high as $10^8$ to $10^9$ cm$^{-2}$, so the film cannot be regarded as a high-quality epitaxially grown film, posing a serious problem in practical use of optical or electron devices.

From this viewpoint, to lower the dislocation density of an epitaxially grown GaN film, strong demand has arisen for a substrate material having smaller lattice mismatch to GaN.

As a substrate material having smaller lattice mismatch to GaN than sapphire, 6H-Sic is most popularly used. However, 6H-Sic has a high melting point (2,700° C.), which makes it difficult to manufacture a large single crystal. In addition, a defect called a micropipe is readily formed in growing the single crystal, so the crystal quality as a substrate material is unsatisfactory.

Unlike the conventional substrate materials, lithium gallate (LiGaO$_2$) has a distorted wurtzite type crystal structure, i.e., almost the same crystal structure as that of GaN as a hexagonal crystal. The lattice mismatch to GaN as the hexagonal crystal is estimated as about 0.9% on the basis of the lattice constant of LiGaO$_2$, i.e., much smaller than that of the conventional substrate material. A GaN thin film can be grown on the c-plane of the LiGaO$_2$ single-crystal substrate.

Conventionally, however, the following problem is posed. The LiGaO$_2$ crystal is an inverted symmetrical crystal belonging to point group mm2, i.e., space group Pna2$_1$ and has a polarity along the c-axis direction. When this crystal is pulled up in the c-axis direction by the Czochralski (CZ) method, and a c-plane substrate is formed by cutting the c-plane perpendicular to the c-axis direction, $-c$ and $+c$ regions having a domain structure are simultaneously formed on the substrate surface because of polarity inversion.

Even when the GaN thin film is grown, a region where the thin film is epitaxially grown and a region where the thin film is peeled off are formed, so the LiGaO$_2$ crystal cannot be used as the substrate for epitaxial growth in practice.

When the $-c$ and $+c$ regions are simultaneously present as the domain structure, the substrate surface has a step as will be described below.

The c-plane perpendicular to the c-axis direction is cut from the LiGaO$_2$ single crystal which is formed by pulling up the crystal in the c-axis direction by the CZ method, thereby forming a single-crystal substrate. When the surface of the single-crystal substrate is polished by chemical-mechanical polishing, a crossed line 202 radially extending from the center of a substrate 201 is observed, as shown in FIG. 2A.

More detailed observation of the crossed line portion reveals that +c regions and −c regions alternate, as shown in FIG. 2B. FIG. 2B shows a section taken along an arrow in FIG. 2A.

SUMMARY OF THE INVENTION

It is therefore an object of the present invention to provide an LiGaO$_2$ single crystal, a LiGaO$_2$ single-crystal substrate, and a method of manufacturing the same, which can uniformly form a gallium-nitride-based semiconductor epitaxial thin film having a lower dislocation density on an LiGaO$_2$ single-crystal substrate.

In order to achieve the above object, according to an aspect of the present invention, there is provided an LiGaO$_2$ single crystal manufactured by the Czochralski method, having a crystallographic axis as a pulling direction set within an angle range of 30° from a b-axis (010) direction.

According to another aspect of the present invention, there is provided an LiGaO$_2$ single crystal manufactured by the Czochralski method, having a crystallographic axis as a pulling direction set within an angle range of 30° from an a-axis (100) direction.

According to still another aspect of the present invention, there is provided an LiGaO$_2$ single-crystal substrate comprising an LiGaO$_2$ single crystal manufactured by the Czochralski method and having a crystallographic axis as a pulling direction set within an angle range of 30° from a b-axis (010) direction, wherein a major surface corresponds to a c-plane.

According to still another aspect of the present invention, there is provided an LiGaO$_2$ single-crystal substrate comprising an LiGaO$_2$ single crystal manufactured by the Czochralski method and having a crystallographic axis as a pulling direction set within an angle range of 30° from an a-axis (100) direction, wherein a major surface corresponds to a c-plane.

According to still another aspect of the present invention, there is provided a method of manufacturing an LiGaO$_2$ single crystal, comprising inserting an LiGaO$_2$ seed crystal cut in a direction of an angle range of 30° from a b-axis (010)

direction into an LiGaO$_2$ melt and pulling the seed crystal by the Czochralski method to grow the LiGaO$_2$ single crystal.

According to still another aspect of the present invention, there is provided a method of manufacturing an LiGaO$_2$ single crystal, comprising inserting an LiGaO$_2$ seed crystal cut in a direction of an angle range of 30° from an a-axis (100) direction into an LiGaO$_2$ melt and pulling the seed crystal by the Czochralski method to grow the LiGaO$_2$ single crystal.

According to still another aspect of the present invention, there is provided a method of manufacturing an LiGaO$_2$ single-crystal substrate, comprising inserting an LiGaO$_2$ seed crystal cut in a direction of an angle range of 30° from a b-axis (010) direction into an LiGaO$_2$ melt, pulling the seed crystal by the Czochralski method to grow the LiGaO$_2$ single crystal, and cutting a c-plane from the single crystal to obtain the LiGaO$_2$ single-crystal substrate having a major surface corresponding to the c-plane.

According to still another aspect of the present invention, there is provided a method of manufacturing an LiGaO$_2$ single-crystal substrate, comprising inserting an LiGaO$_2$ seed crystal cut in a direction of an angle range of 30° from an a-axis (100) direction into an LiGaO$_2$ melt, pulling the seed crystal by the Czochralski method to grow the LiGaO$_2$ single crystal, and cutting a c-plane from the single crystal to obtain the LiGaO$_2$ single-crystal substrate having a major surface corresponding to the c-plane.

BRIEF DESCRIPTION OF THE DRAWINGS

FIG. 1A is a perspective view for explaining the crystal state of an LiGaO$_2$ single crystal according to the present invention;

FIGS. 1B to 1D are perspective views for explaining an LiGaO$_2$ single-crystal substrate according to the present invention and a method of manufacturing the same.

DESCRIPTION OF THE PREFERRED EMBODIMENTS

Figure 2A:
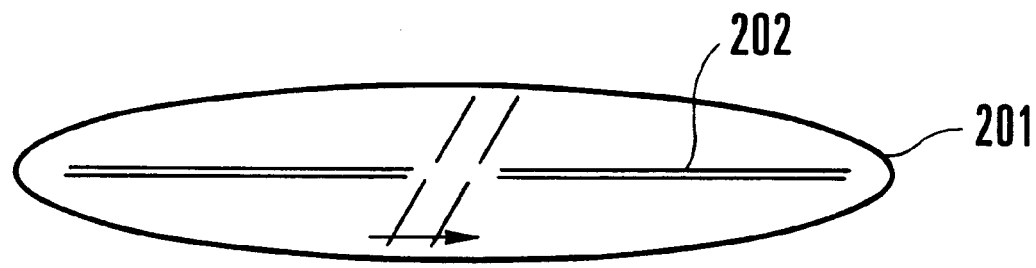
FIGS. 2A and 2B are views for explaining an LiGaO$_2$ single-crystal substrate manufactured by a conventional method.
Figure 2B:
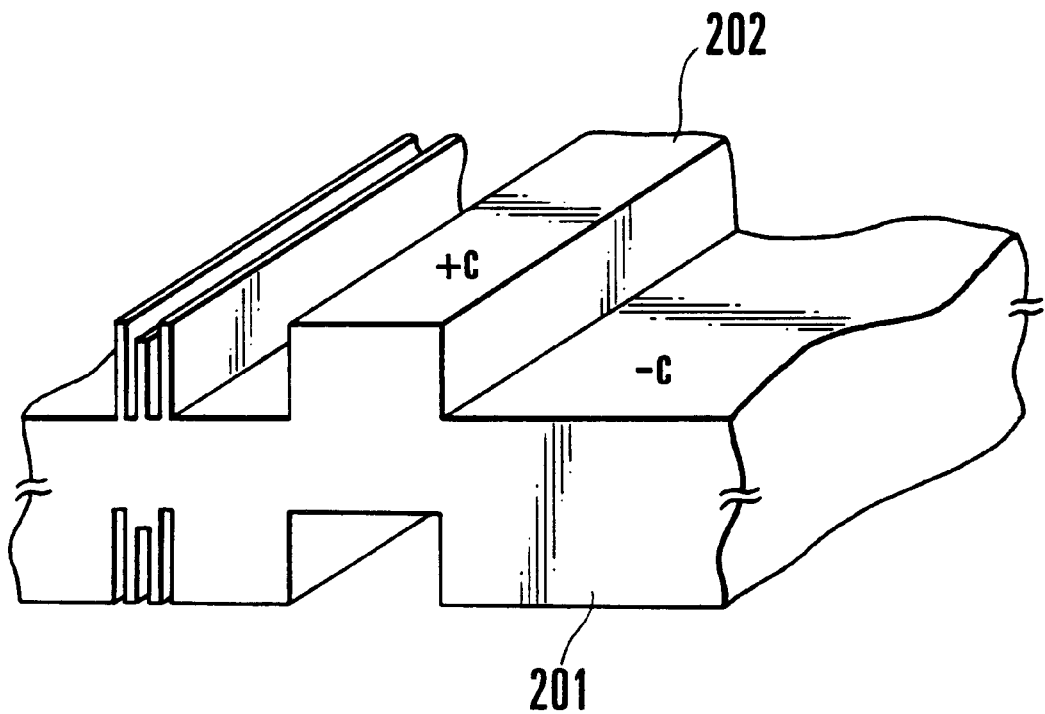

The embodiments of the present invention will be described below.

The gist of the present invention will be described first.

The present inventors estimated the reason why regions with difference polarities were present in an LiGaO$_2$ single crystal which was grown by pulling up the crystal in the c-axis direction by the CZ method.

LiGaO$_2$ is a piezoelectric crystal, and the LiGaO$_2$ single crystal has a polarity axis along the c-axis direction. When the LiGaO$_2$ crystal is grown by pulling up the crystal in the c-axis direction, the thermal distortion energy generated in cooling immediately under the melting point is relaxed by forming a domain structure by inverting the polarity. For this reason, when the crystal is pulled up in the c-axis direction to grow the crystal, a −c region 102 and a +c region 103, which have different polarities, are simultaneously formed in an LiGaO$_2$ single crystal 101, as shown in FIG. 1A.

The b- and a-axes are not polarity axes. Therefore, the present inventors predicted as follows. When the crystal is pulled up in the directions of b- and a-axes, the domain structure due to polarity inversion is not formed even when the thermal distortion energy is generated in cooling immediately under the melting point, and a single crystal having a single-domain structure can be grown.

Under this prediction, the present inventors conducted a number of experiments to find the pulling condition for growing the single crystal having the single-domain structure, and found that LiGaO2 single crystals 104a and 104b having a single-domain structure could be grown in the range of a certain deviation angle in the b- or a-axis direction, as shown in FIGS. 1B and 1D. When a c-plane 105 is cut from the resultant LiGaO$_2$ single crystal 104a or 104b, the surface of resultant LiGaO$_2$ single-crystal substrate 106a or 106b has no domain structure, as shown in FIGS. 1C and 1D.

As shown in FIG. 1F, when a thin film 107 consisting of a nitride semiconductor based on GaN is grown on the LiGaO$_2$ single-crystal substrate 106a having no domain structure, the thin film 107 most satisfactorily lattice-matches to the LiGaO$_2$ single crystal, so dislocation in the grown thin film 107 can be reduced. Use of the LiGaO$_2$ single-crystal substrate 106a having the thin film 107 consisting of a nitride semiconductor thereon allows to obtain a device having excellent characteristics because dislocation can be reduced.

EXAMPLE 1

FIGS. 1A and 1B explain the first embodiment of the present invention.

In Example 1, in crystal growth using the pulling method, crystals were pulled up within the range of an angle range of 30° from the b-axis (010) direction to grow LiGaO$_2$ single crystals, and c-plane substrates were cut from the single crystals.

More specifically, lithium carbonate (Li$_2$CO$_3$) with a purity of 99.999% and gallium oxide (Ga$_2$O$_3$) were mixed at a stoichiometric ratio. LiGaO$_2$ obtained by sintering the mixture at 1,300° C. for 20 hours was ground to prepare a source material. This source material was put into an iridium crucible and melted by RF heating. Next, the seed crystal was cut in the b-axis (010) direction to expose the b-plane. The seed crystal was inserted into the melt such that the b-plane was parallel to the melt surface, and slowly pulled up to grow each single crystal. In crystal growth by the pulling method, when the orientation of the seed crystal is determined in advance, a crystal having the same orientation as that of the seed crystal can be grown.

The grown single crystal was removed and annealed at about 800° C. for about 20 hours to reduce the distortion in the grown single crystal.

The axis was set such that the c-plane was exposed from the single crystal, the crystal was cut to a thickness of about 0.5 mm, and the surface of the c-plane was mechanically polished using alumina powder as an abrasive.

The surface was etched using an aqueous solution of nitric acid at an appropriate concentration, and the polarity of the resultant substrate surface was determined.

Table 1 shows the relationship between the single-domain ratio of the polarity on the substrate surface obtained by the above method and the orientation of the seed crystal used as the seed for single crystal. In Table 1, angle 1 is the angle measured from the b-axis of the seed crystal in the a-axis direction, and angle 2 is the angle measured from the b-axis in the c-axis direction.

TABLE 1

|        | Angle 1 | Angle 2 | Single-domain ratio (%) |
|--------|---------|---------|-------------------------|
| No. 1  | −35°    | −40°    | 70                      |
| No. 2  | −30°    | −30°    | 100                     |
| No. 3  | −10°    | −10°    | 100                     |
| No. 4  | −5°     | −10°    | 100                     |
| No. 5  | 0°      | 0°      | 100                     |
| No. 6  | 5°      | 10°     | 100                     |
| No. 7  | 30°     | 30°     | 100                     |
| No. 8  | 25°     | 40°     | 80                      |
| No. 9  | −20°    | 15°     | 100                     |
| No. 10 | −25°    | 40°     | 90                      |
| No. 11 | 20°     | −30°    | 100                     |
| No. 12 | 30°     | −40°    | 80                      |

As is apparent from Table 1, when the seed crystal cut within the angle range of 30° from the b-axis (010) direction is used to pull up the crystal, an LiGaO$_2$ single crystal having a single-domain structure can be grown.

EXAMPLE 2

Example 2 of the present invention will be described below. In Example 1, the seed crystal cut in the b-axis (010) direction was used to pull up the crystal. However, the present invention is not limited to this. A seed crystal cut in the a-axis direction may be used to grow a single crystal by the pulling method (CZ method).

More specifically, lithium carbonate (Li$_2$CO$_3$) with a purity of 99.999% and gallium oxide (Ga$_2$O$_3$) were mixed at a stoichiometric ratio. LiGaO$_2$ obtained by sintering the mixture at 1,300° C. for 20 hours was ground to prepare a source material. This source material was put into an iridium crucible and melted by RF heating. Next, the seed crystal was cut in the a-axis (100) direction to expose the a-plane. The seed crystal was inserted into the melt such that the a-plane was parallel to the melt surface, and slowly pulled up to grow each single crystal.

Each grown single crystal was removed and annealed at about 800° C. for about 20 hours to reduce the distortion in the grown single crystal.

The axis was set such that the c-plane was exposed from the single crystal, the crystal was cut to a thickness of about 0.5 mm, and the surface of the c-plane was mechanically polished using alumina powder as an abrasive.

The surface was etched using an aqueous solution of nitric acid at an appropriate concentration, and the polarity of the resultant substrate surface was determined.

Table 2 shows the relationship between the single-domain ratio of the polarity on the substrate surface obtained by the above method and the orientation of the seed crystal used as the seed for single crystal. In Table 2, angle 3 is the angle measured from the a-axis of the seed crystal in the b-axis direction, and angle 4 is the angle measured from the a-axis in the c-axis direction.

TABLE 2

|        | Angle 3 | Angle 4 | Single-domain ratio (%) |
|--------|---------|---------|-------------------------|
| No. 13 | −40°    | −40°    | 70                      |
| No. 14 | −30°    | −30°    | 100                     |
| No. 15 | −10°    | −10°    | 100                     |
| No. 16 | −5°     | −10°    | 100                     |

TABLE 2-continued

|        | Angle 3 | Angle 4 | Single-domain ratio (%) |
|--------|---------|---------|-------------------------|
| No. 17 | 0°      | 0°      | 100                     |
| No. 18 | 5°      | 10°     | 100                     |
| No. 19 | 30°     | 30°     | 100                     |
| No. 20 | 25°     | 40°     | 80                      |
| No. 21 | −20°    | 15°     | 100                     |
| No, 22 | −40°    | 30°     | 90                      |
| No. 23 | 20°     | −25°    | 100                     |
| No. 24 | 30°     | −40°    | 85                      |

As is apparent from Table 2, when the seed crystal cut within the angle range of 30° from the a-axis (100) direction is used to pull up the crystal, an LiGaO$_2$ single crystal having a single-domain structure can be grown.

As described above, when etching is performed using an aqueous solution of nitric acid at an appropriate concentration, the polarity of the resultant substrate surface can be determined. This will be described in more detail.

As described in Example 1, the seed crystal cut in the b-axis (010) direction is used to grow each LiGaO$_2$ single crystal by the pulling method, and the c-plane is cut from this single crystal, thereby forming the LiGaO$_2$ single-crystal substrate having the c-plane with a single-domain structure on its surface. On the other hand, each LiGaO$_2$ single crystal is grown using a seed crystal cut in the c-axis direction, as in the prior art, and the c-plane is cut from this single crystal, thereby forming the LiGaO$_2$ single-crystal substrate having a domain structure on its surface. In this single-crystal substrate having the domain structure, −c and +c regions are present almost half-and-half. The surface of the single-crystal substrate having the domain structure will be called a domain c-plane hereinafter.

The single-crystal substrate having the single-domain structure is dipped in an aqueous solution of nitric acid (HNO$_3$:H$_2$O=1:1) at 150° C. for one minute to etch the single-crystal substrate surface. A c-plane which is easily etched will be referred to as a surface A, and a c-plane which is hardly etched will be referred to as a surface B.

The surface A is etched at a rate higher than that of the surface B by at least one order of magnitude. When etching progresses, a relatively large rhombic mesa pattern (etching pattern) is generated on the surface A. On the other hand, a fine elliptical mesa pattern (etching pattern) is generated on the surface B. Therefore, the surfaces A and B of the single-crystal substrate can be discriminated on the basis of the difference in etching pattern. In the above-described domain c-plane, the surfaces A and B are present almost half-and-half.

A GaN thin film was epitaxially grown on each of the domain c-plane, the surface A, and the surface B. This epitaxial growth was performed by molecular-beam epitaxy while setting the substrate temperature at 750° C. and irradiating nitrogen radicals and gallium flux from a radical beam source onto each substrate surface on which the film is to be formed. The grown GaN thin film was characterized by RHEED (high energy electron diffraction) and X-ray diffraction, and it was confirmed that the GaN thin film was wurtzite type GaN.

The proportion of an area where the GaN thin film was grown on each substrate surface was observed. Table 3 shows the result.

TABLE 3

|  | Proportion of surface A (%) | Proportion of surface B (%) | Proportion of crystal grown area (%) |
|---|---|---|---|
| Surface A | 100 | 0 | 0 |
| Surface B | 0 | 100 | 100 |
| Domain c-plane | 50 | 50 | 50 |

As shown in Table 3, no GaN crystal was grown on the surface A. Observation of the crystal growth process revealed that the GaN thin film formed on the surface A was immediately peeled off.

As is apparent from the above description, the GaN crystal is grown on the surface B which is hardly etched by an aqueous solution of nitric acid while no GaN crystal is grown on the surface A which is easily etched.

Therefore, a surface which is hardly etched using an aqueous solution of nitric acid can be determined as a surface where the GaN thin film can be grown.

On the above-described surface B, the grown GaN thin film is a material which most satisfactorily lattice-matches to the LiGaO$_2$ single crystal, so dislocation on the grown GaN thin film can be reduced. Use of the above-described surface B of the LiGaO$_2$ single-crystal substrate having a thin film consisting of a nitride semiconductor such as a GaN film thereon allows to obtain a device having excellent characteristics dislocation can be reduced.

More detailed survey of the surface etched by an aqueous solution of nitric acid at a high rate and that melted at a low rate revealed that the surface A was an oxygen surface, and the surface B was a metal surface containing lithium and gallium. In this survey, coaxial direct collision ion scattering spectroscopy was used, in which helium ions were made to collide against the substrate surface, and the time of flight in ion scattering was measured, thereby identifying the atom species on the substrate surface.

More specifically, the c-plane of the LiGaO$_2$ single crystal, which is hardly etched, is a metal surface, and the c-plane which is easily etched is an oxygen surface.

This also applies to a case wherein an AlN thin film or an InN thin film is grown using Al or In as a flux source.

In the above example, the crystal is grown on the LiGaO$_2$ single-crystal substrate by molecular-beam epitaxy. However, the present invention is not limited to this. Even when a GaN thin film was grown by metalorganic chemical vapor deposition (MOCVD) using trimethyl gallium as a Ga source and ammonia as an N source while supplying a nitrogen gas as the carrier gas, the same effect as described above was obtained.

In the above example, HNO$_3$:H$_2$O=1:1 was used as the aqueous solution of nitric acid. However, even when HNO$_3$:H$_2$O=2:1 to 1:2 was used, the same determination as described above could be made. Although the etching rate depends on the temperatures of an etchant, the etchant temperature may be set within the range of 100° C. to 250° C. At higher temperatures, the etch rate becomes too high, and the etching pattern is indistinct, so no accurate determination can be made.

As has been described above, according to the present invention, the LiGaO$_2$ seed crystal cut in the direction of the angle range of 30° from the b-axis (101) or a-axis (100) direction is inserted into the LiGaO$_2$ melt, and the seed crystal is pulled up by the CZ method, thereby growing the LiGaO$_2$ single crystal.

Therefore, the grown single crystal has a single-domain structure.

In the method of manufacturing the single-crystal substrate of the present invention, the LiGaO$_2$ seed crystal cut in the direction of the angle range of 30° from the b-axis (010) or a-axis (100) direction is inserted into the LiGaO$_2$ melt, and the seed crystal is pulled up by the CZ method. The c-plane is cut from the resultant LiGaO$_2$ single crystal, thereby forming the LiGaO$_2$ single-crystal substrate with a major surface corresponding to the c-plane.

In addition, the two surfaces of the LiGaO$_2$ single-crystal substrate are etched using an aqueous solution of nitric acid, and a surface where the etching rate is low is used to epitaxially grow a nitride semiconductor thin film.

Therefore, the entire region of the surface of the resultant substrate has a single-domain structure. The surface where the etching rate is low is a metal surface containing lithium and gallium.

In the present invention, a gallium-nitride-based semiconductor can be uniformly formed on the LiGaO$_2$ single-crystal substrate surface. In addition, since the lattice mismatch between the gallium-nitride-based semiconductor and the LiGaO$_2$ single crystal is small, a gallium-nitride-based semiconductor epitaxial thin film with a lower dislocation density can be formed.

What is claimed is:

1. An LiGaO$_2$ single crystal manufactured by the Czochralski method, having a crystallographic axis as a pulling direction set within an angle range of 30° from a b-axis (010) direction.

2. An LiGaO$_2$ single crystal manufactured by the Czochralski method, having a crystallographic axis as a pulling direction set within an angle range of 30° from an a-axis (100) direction.

3. An LiGaO$_2$ single-crystal substrate comprising:

an LiGaO$_2$ single crystal manufactured by the Czochralski method and having a crystallographic axis as a pulling direction set within an angle range of 30° from a b-axis (010) direction, wherein a major surface corresponds to a c-plane.

4. A substrate according to claim 3, wherein a thin film essentially consisting of a nitride compound semiconductor is formed on said major surface.

5. A substrate according to claim 4, wherein the nitride compound semiconductor essentially consists of a GaN-based material.

6. An LiGaO$_2$ single-crystal substrate comprising:

an LiGaO$_2$ single crystal manufactured by the Czochralski method and having a crystallographic axis as a pulling direction set within an angle range of 30° from an a-axis (100) direction, wherein a major surface corresponds to a c-plane.

7. A substrate according to claim 6, wherein a thin film essentially consisting of a nitride compound semiconductor is formed on said major surface.

8. A substrate according to claim 7, wherein the nitride compound semiconductor essentially consists of a GaN-based material.

* * * * *